United States Patent

Kazato et al.

Patent Number: 5,821,882
Date of Patent: Oct. 13, 1998

[54] DATA CONVERSION METHOD AND APPARATUS

[75] Inventors: Hirohiko Kazato; Tomoki Hosoi, both of Tokyo, Japan

[73] Assignee: Yamatake-Honeywell Co., Ltd., Tokyo, Japan

[21] Appl. No.: 704,145

[22] Filed: Aug. 28, 1996

[30] Foreign Application Priority Data

Aug. 31, 1995 [JP] Japan ............................. 7-223918

[51] Int. Cl.$^6$ .................................................. H03M 7/00
[52] U.S. Cl. .............................. 341/50; 341/51; 341/61
[58] Field of Search ............................ 341/50, 51, 61; 348/402, 407

[56] References Cited

U.S. PATENT DOCUMENTS

| | | | |
|---|---|---|---|
| 5,365,271 | 11/1994 | Asano | 348/402 |
| 5,412,741 | 5/1995 | Shapiro | 382/232 |
| 5,495,292 | 2/1996 | Zhang et al. | 348/407 |
| 5,619,998 | 4/1997 | Abdel-Malek et al. | 128/660.07 |

OTHER PUBLICATIONS

"ECG Data Compression Techniques—A Unified Approach", IEEE Transactions on Biomedical Engineering. vol. 17. No. 4, Apr. 1990.

"ECG Data Compression by Using Wavelet Transform", IEICE Trans, Inf. & Syst., vol. E76–D, No. 12 Dec. 1993.

*Primary Examiner*—Marc S. Hoff
*Assistant Examiner*—Jason L. W. Kost
*Attorney, Agent, or Firm*—Blakely Sokoloff Taylor & Zafman

[57] ABSTRACT

According to a data conversion method and apparatus, an original signal is wavelet-transformed with a desired expansion count to generate transformed data. The transformed data is corrected such that a difference between the original signal and a value obtained by inversely wavelet-transforming the transformed data falls within a desired tolerance range, thereby generating the corrected transformed data as compressed data in which the original signal is compressed.

24 Claims, 12 Drawing Sheets

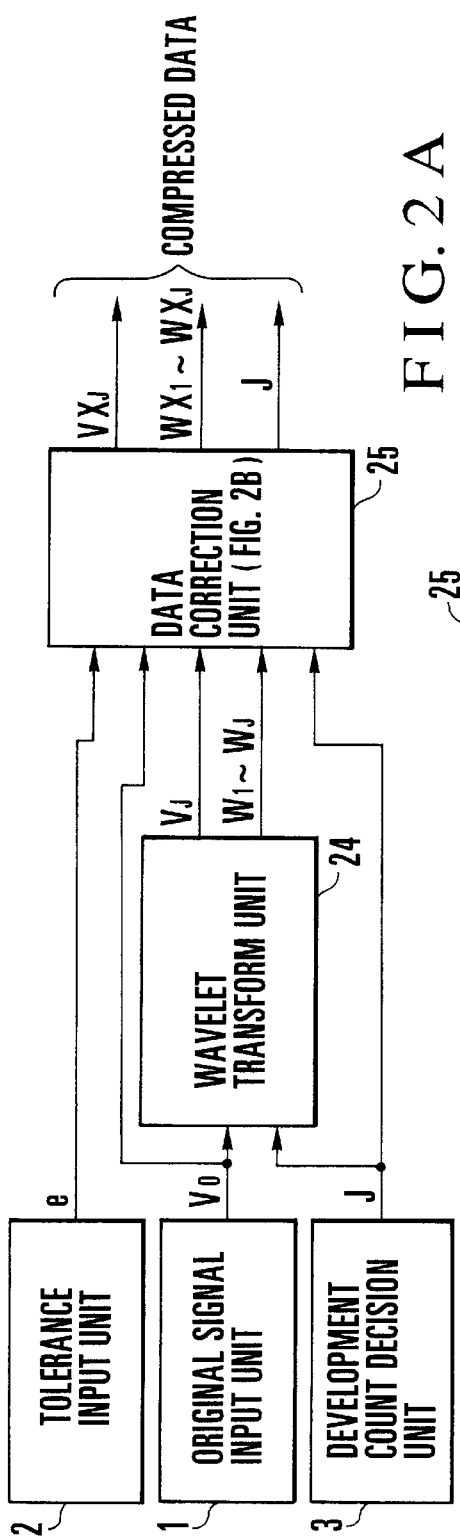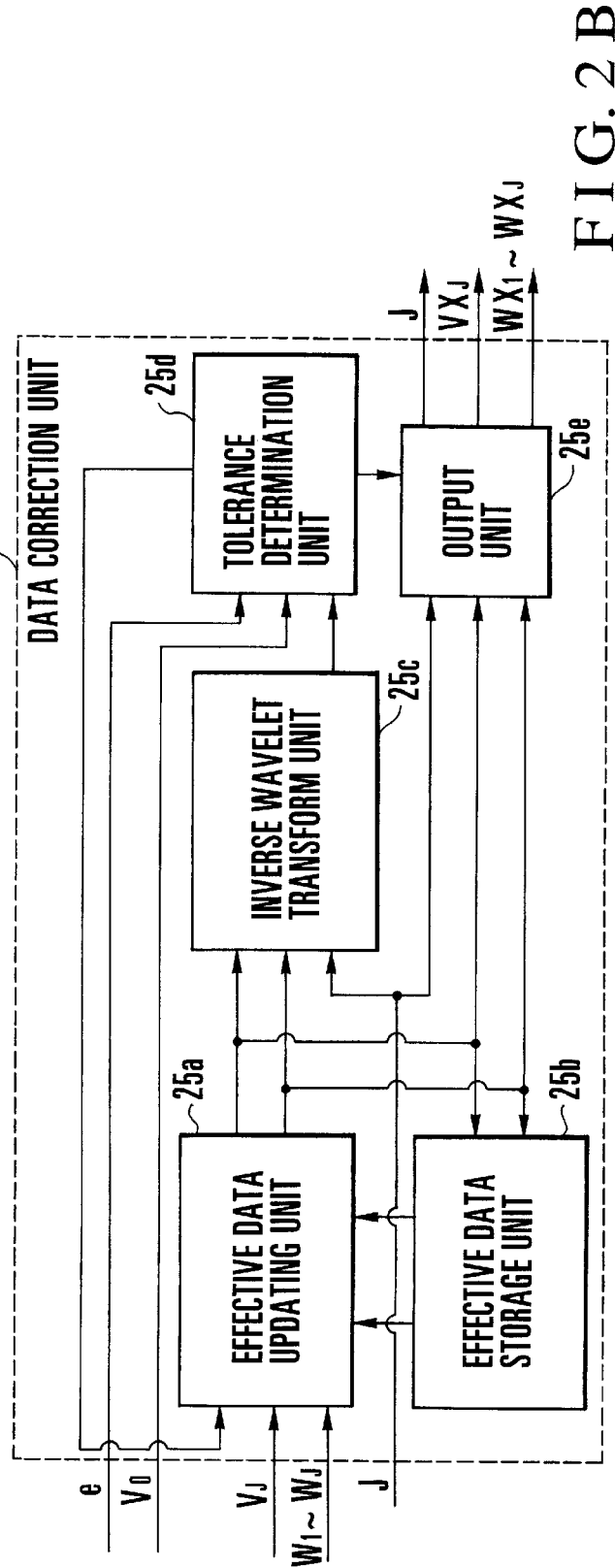

DATA CONVERSION METHOD AND APPARATUS

BACKGROUND OF THE INVENTION

The present invention relates to a data conversion apparatus for compressing/expanding image data, speech data, process data or measurement data of pressure, voltage, and the like.

Non-reversible compression techniques are mainly classified into a direct compression method for directly deleting redundancy data and a transform compression method for extracting features using orthogonal transform.

Of these compression methods, most of the data compression methods capable of setting a tolerance belong to the direct compression method.

Of all the methods belonging to the direct compression method, the data compression methods capable of setting a tolerance are enumerated by a zero-order predictive compression method, a first-order predictive compression method, a zero-order interpolation compression method, a first-order interpolation compression method, and the like.

Each of these techniques is based on first-order approximation of all data.

Among them all, the first-order interpolation compression method has the highest compression ratio. This first-order interpolation compression method will be briefly described below.

Let $X_n$ be the data at given time $t_n$, and a start point $X_0$ is preserved as a necessary point.

Two straight lines are drawn from the start point $X_0$ to upper and lower points within a tolerance e from a next point $X_1$ and defined as $U_1$ and $L_1$.

Similarly, two straight lines $U_2$ and $L_2$ are drawn from the start point $X_0$ to upper and lower points within the allowable range e from a second succeeding point $X_2$ of the start point $X_0$.

When an overlap portion between an area defined by the straight lines $U_2$ and $L_2$ and an area defined by the straight lines $U_1$ and $L_1$ is absent, the point $X_1$ is stored as necessary data. This point $X_1$ is used as a new start point, and the above operation is repeated.

If an overlap portion is present, the point $X_1$ is regarded as unnecessary data and deleted. Two straight lines are drawn from the start point $X_0$ to upper and lower points within the allowable range e from a third succeeding point $X_3$ of the start point $X_0$ and defined as $U_3$ and $L_3$.

If an overlap portion between an area defined by the straight lines $U_3$ and $L_3$ and the area defined by the straight lines $U_1$ and $L_1$ and $U_2$ and $L_2$ is present, the point $X_2$ is regarded as unnecessary data and deleted. If no overlap portion is present, the point $X_2$ is stored as necessary data.

Similarly, two straight lines $U_n$ and $L_n$ are drawn from a start point $X_m$ to upper and lower points within the allowable range e from a point $X_n$. If an overlap portion between an area defined by the two straight lines $U_n$ and $L_n$ and an area defined by two straight lines $U_k$ and $L_k$ (here, k=m+1 to n−1) is present, a point $X_{n-1}$ is regarded as unnecessary data and deleted.

In addition to the above technique, a data compression technique using wavelet transform is available.

Wavelet transform techniques are classified into continuous wavelet transform and discrete wavelet transform depending on their natures. The discrete wavelet transform techniques are further classified into orthogonal wavelet transform and nonorthogonal wavelet transform depending on whether inverse transform is uniquely determined.

Since wavelet transform used in data compression is orthogonal wavelet transform, a description will be given to the orthogonal wavelet transform.

A signal present on the time axis is defined as $V_0$: $V_0(n)$ {n=1, 2, ..., N}. Orthogonal wavelet transform is given by equations (1) below:

$$\left.\begin{array}{l} V_{j+1}(n) = \sum_{i=1}^{k} \alpha_i V_j(2n+i) \\ W_{j+1}(n) = \sum_{i=1}^{k} \beta_i V_j(2n+i) \end{array}\right\} \quad (1)$$

By these equations, a signal $V_1$: $V_1(n)$ {n=1, 2, ..., N/2} and a signal $W_1$: $W_1(n)$ {n=1, 2, ..., N/2} are obtained from the signal $V_0$. Similarly, a signal $V_{j+1}$: $V_{j+1}(n)$ {n=1, 2, ..., N/$2^{j+1}$} and a signal $W_{j+1}$: $W_{j+1}(n)$ {n=1, 2, ..., N/$2^{j+1}$} are obtained from a signal $V_j$: $V_j(n)$ {n=1, 2, ..., N/$2^j$}.

Inverse orthogonal wavelet transform can be given by equations (2) below:

$$\left.\begin{array}{l} V_j(2n) = \sum_{m=1}^{k} \gamma_{2m} V_{j+1}(n-m) \sum_{m=1}^{k} \phi_{2m} W_{j+1}(n-m) \\ V_j(2n+1) = \sum_{m=1}^{k} \gamma_{2m+1} V_{j+1}(n-m) \sum_{m=1}^{k} \phi_{2m+1} W_{j+1}(n-m) \end{array}\right\} \quad (2)$$

To obtain the original time region signal $V_0$ by inverse transform, the signals $V_j$ and $W_1$ to $W_j$ {j is a natural number} obtained by wavelet transform are required.

When a data count N of the time region signal $V_0$ is divided by $2^j$, the sum of the number of data of $V_j$ and $W_1$ to $W_j$ becomes N, which is equal to the data count of the signal $V_0$.

As described above, the orthogonal wavelet transform can be regarded as a transform of decomposing the signal $V_0$ on the time region into signals $V_j$ and $W_1$ to $W_j$ on a plurality of time frequency regions.

The signal $V_j$ is a signal obtained as if an original signal had passed through a low-pass filter, and is called a smoothed signal. The signals $W_1$ to $W_j$ are signals obtained as if the original signal had passed through a bandpass filter, and are called details signals.

Data compression using wavelet transform is performed by the following procedures.

① The original data is defined as the signal $V_0$: $V_0(n)$ {n=1, 2, ..., N}, and $V_0$ is subjected to orthogonal wavelet transform j times to obtain the smoothed signal $V_j$ and a plurality of details signals $W_1$ to $W_j$.

② The smoothed signal $V_j$ and the details signals $W_1$ to $W_j$ are respectively quantized to delete data having small amplitudes in these signals.

③ A combination of the quantized smoothed signal $V_j$ and the quantized details signals $W_1$ to $W_j$ is defined as compressed data.

④ The compressed data is expanded by inverse orthogonal wavelet transform.

In the above conventional data compression/expansion technique capable of setting a tolerance, since a target signal is approximated by straight lines, discontinuous points which were not present in the original signal are generated when compressed data is expanded. This drawback typically appears when the target signal is smooth.

A signal expanded by this technique becomes different from the original signal in terms of continuity and frequency characteristics. Therefore, resultant signal cannot be used in abnormality diagnosis for checking signal continuities and in signal frequency analysis.

To the contrary, in the conventional data compression using wavelet transform, compressed/expanded data is free from discontinuous points which are not present in the original signal.

The wavelet transform only expands data using a predetermined function and cannot change the data itself. A tolerance cannot be set for the original signal in this data compression. For this reason, each expanded data point has no reliability, and it is difficult to perform signal processing using a threshold.

SUMMARY OF THE INVENTION

The present invention has been made to solve the conventional problems described above, and has as its object to obtain a higher reliability where expanded data formerly compressed by data compression using wavelet transform is almost equal to the original data.

In order to achieve the above object of the present invention, there is provided a data conversion method comprising the steps of wavelet-transforming an original signal with a desired expansion count to generate transformed data, and correcting the transformed data such that a difference between the original signal and a value obtained by inversely wavelet-transforming the transformed data falls within a desired tolerance range, thereby generating the corrected transformed data as compressed data in which the original signal is compressed.

BRIEF DESCRIPTION OF THE DRAWINGS

FIGS. 2A and 2B are block diagrams showing the arrangement of a data compression apparatus according to the second embodiment of the present invention;

DESCRIPTION OF THE PREFERRED EMBODIMENTS

The first embodiment of the present invention will be described with reference to the accompanying drawings.
First Embodiment FIG. 1 shows an arrangement in which a data conversion apparatus according to the first embodiment of the present invention is used as a data compression apparatus.

Figure 1:
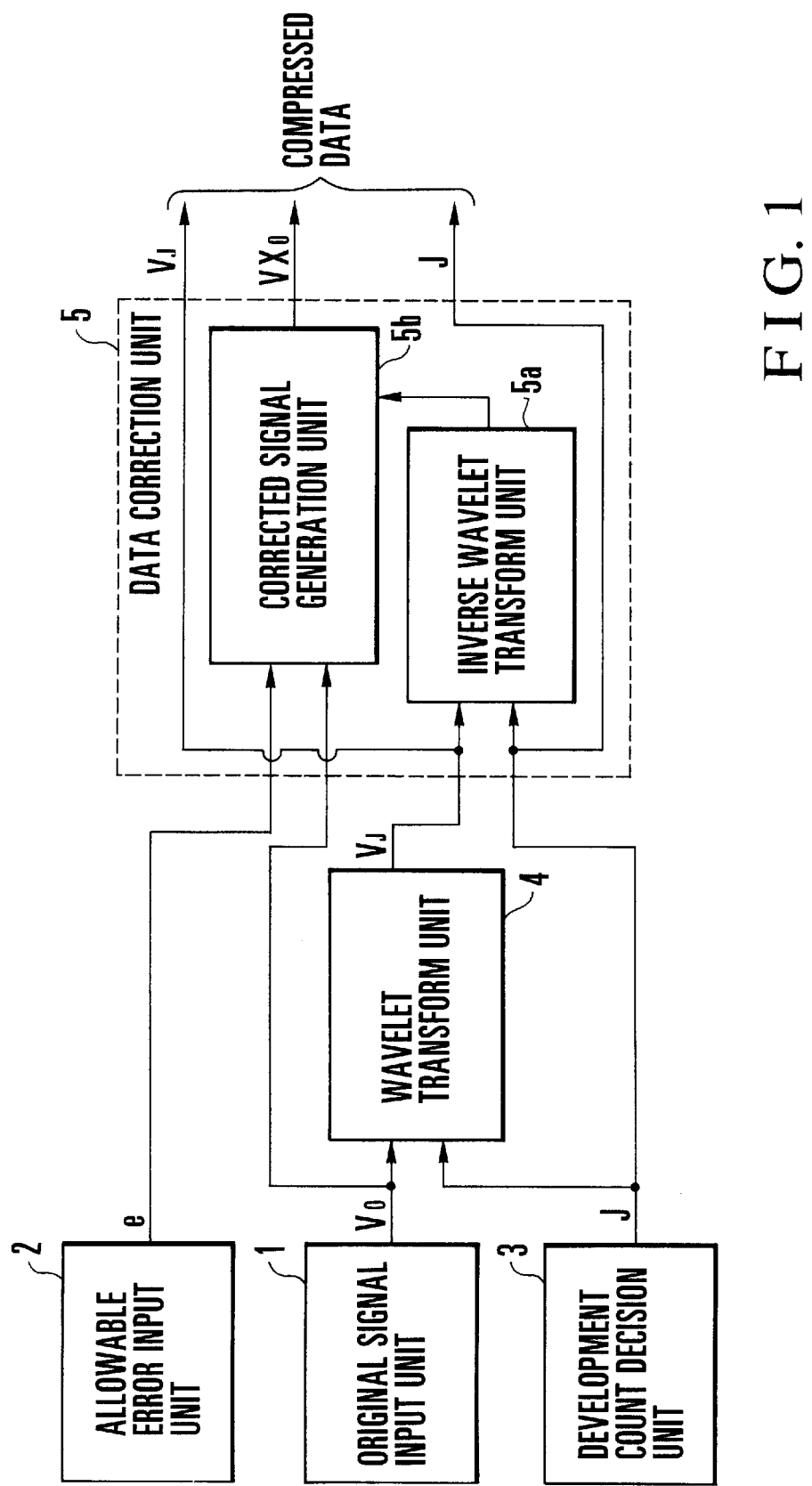
FIG. 1 is a block diagram showing the arrangement in which a data conversion apparatus according to the first embodiment of the present invention is used as a data compression apparatus.

Referring to FIG. 1, reference numeral 1 denotes an original signal input unit for outputting a compression target as an original signal $V_0$: $V_0(n)$ $\{n=1, 2, \ldots, N\}$ consisting of N data. Reference numeral 2 denotes a tolerance input unit for outputting, as a tolerance e, an allowable range of errors between the original signal and a compressed/expanded signal. Reference numeral 3 denotes an expansion count decision unit for outputting an expansion count J of wavelet transform. Reference numeral 4 denotes a wavelet transform unit for obtaining a smoothed signal $V_j$ by equation (3) using the original signal $V_0$ and the expansion count J:

$$V_{j+1}(n) = \sum_{i=1}^{k} \alpha_i V_j(2n + i) \qquad (3)$$

where k is the number of terms of a filter.

Reference numeral 5 denotes a data correction unit for outputting a corrected signal $VX_0$: $VX_0(n)$ $\{n=1, 2, \ldots, N\}$ consisting of N data from the smoothed signal $V_j$, the original signal $V_0$, the tolerance e, and the expansion count J. The data correction unit 5 comprises an inverse wavelet transform unit 5a and a corrected signal generation unit 5b.

The inverse wavelet transform unit 5a outputs an inversely transformed signal $VI_0$: $VI_0(n)$ $\{n=1, 2, \ldots, N\}$ consisting of N data by equations (4) using the smoothed signal $V_j$ and the expansion count J:

$$\left. \begin{array}{l} VI_j = V_j \\[4pt] VI_j(2n) = \sum_{m=1}^{k} \gamma_{2m} VI_{j+1}(n - m) \\[4pt] VI_j(2n + 1) = \sum_{m=1}^{k} \gamma_{2m+1} VI_{j+1}(n - m) \end{array} \right\} \qquad (4)$$

The corrected signal generation unit 5b performs the following processing from n=1 to n=N to generate and output the corrected signal $VX_0$.

The nth data of the original signal is compared with the nth data of the inversely transformed signal using the original signal $V_0$, the inversely transformed signal $VI_0$, and the tolerance e.

When the absolute value of the error is equal to or smaller than the tolerance e, the nth data of the corrected signal is defined as 0 ($|VI_0(n)-V_0(n)| \leq e \to VX_0(n)=0$).

When the absolute value of the error is larger than the tolerance e, the nth data of the corrected signal is updated to the nth data of the original signal ($|VI_0(n)-V_0(n)| > e \to VX_0(n)=V_0(n)$).

As a result of the above processing, the corrected signal generation unit 5b generates and outputs the corrected signal $VX_0$: $VX_0(n)$ $\{n=1, 2, \ldots, N\}$ consisting of N data.

As described above, according to the first embodiment, the tolerance can be set as follows.

The original signal is set as the corrected signal $VX_0$ for a portion in which a difference between the inversely transformed signal $VI_0$ and the original signal $V_0$ falls outside the desired tolerance e. The resultant N corrected signals $VX_0$, the smoothed signal $V_j$, and the expansion count J are set to constitute compressed data. Therefore, the first embodiment does not require details signals.

When the corrected signal $VX_0$: $VX_0(n)$ {n=1, 2, ..., N} serving as a compressed signal obtained from the data correction unit 5 and the smoothed signal are expanded together, the resultant expanded signal is not different from the original signal $V_0$ such that the difference does not exceed the tolerance e.

That is, according to the first embodiment, the tolerance can be set in data compression and expansion.

In the first embodiment, as described above, the details signals are not taken into consideration. When a compression target has a high ratio of low-frequency components, details signals need not often be used. In case the details signals are not used, the calculation time can be shortened, and the compression ratio need not be excessively lowered.

Second Embodiment

FIGS. 2A and 2B show the arrangement of a data compression apparatus according to the second embodiment of the present invention.

Referring to FIG. 2A, reference numeral 24 denotes a wavelet transform unit for generating a smoothed signal $V_j$ and a plurality of details signals $W_1$ to $W_j$ by equations (5) using an original signal $V_0$ and an expansion count J:

$$\left.\begin{array}{l} V_{j+1}(n) = \sum_{i=1}^{k} \alpha_i V_j(2n + i) \\ W_{j+1}(n) = \sum_{i=1}^{k} \beta_i V_j(2n + i) \end{array}\right\} \quad (5)$$

where k is the number of terms of a filter.

Reference numeral 25 denotes a data correction unit for extracting data of the smoothed signal and the plurality of details signals satisfying the tolerance, effective for compression using the smoothed signal $V_j$, the plurality of details signals $W_1$ to $W_j$, the original signal $V_0$, a tolerance e, and the expansion count J. The data correction unit 25 outputs the remaining components as an extracted smoothed signal $VX_j$ and a plurality of extracted details signals $WX_1$ to $WX_j$. Any other arrangement in FIG. 2 is the same as that of FIG. 1.

As shown in FIG. 2B, the data correction unit 25 comprises an effective data updating unit 25a, an effective data storage unit 25b, an inverse wavelet transform unit 25c, a tolerance determination unit 25d, and an output unit 25e.

Upon reception of a control signal from the tolerance determination unit 25d, the effective data updating unit 25a generates $VX_j$ and $WX_1$ to $WX_j$ such that all the errors between the original signal $V_0$ and inversely transformed signals $VI_0$ obtained upon input of the extracted smoothed signal $VX_j$ and the plurality of extracted details signals $WX_1$ to $WX_j$ to the inverse wavelet transform unit 25c fall within the tolerance range.

The effective data updating unit 25a sets initial values as $VX_j \rightarrow V_j$ and $WX_1$ to $WX_j \rightarrow 0$ and gives priorities to all the data of $W_1$ to $W_j$ in an order regarded as important to cause the inversely transformed signals to fall within the tolerance range. Every time an operation is performed, data of $W_1$ to $W_j$ are shifted to $WX_1$ to $WX_j$ one by one.

The priorities are given as follows.

Let $w_{jn}(m)$ be the weight of $W_j(n)$ with respect to $V_0(m)$. For example, if j=2, the weights are derived by equations (6) using equations (8) (to be described later) as follows:

$$\left.\begin{array}{l} W_{2n}(2m) = \phi_{2(m-n)} \\ W_{2n}(2m+1) = \phi_{2(m-n)+1} \end{array}\right\} \quad (6)$$

As an evaluation value for giving priorities to $W_j(n)$, $x_{jn}$ is defined in equation (7):

$$\left.\begin{array}{l} x_{jn} = |W_j(n)| \times \sum_{l=1}^{N} \omega_{jn}(l) \times h_l \\ |VI_1(m) - V_1(m)| \leq e \rightarrow h_m = 0 \\ |VI_1(m) - V_1(m)| > e \rightarrow h_m = 1 \end{array}\right\} \quad (7)$$

In this case, $x_{jn}$ is calculated for j=1 to J and l=1 to N, and the priorities are given from a larger coefficient.

In this case, $x_{jn}=|W_j(n)|$ may be defined to calculate $x_{jn}$ for j=1 to J and n=1 to N, thereby giving priorities from a coefficient having a larger $x_{jn}$ value.

The effective data storage unit 25b stores $VX_j$ and $WX_1$ to $WX_j$ obtained from the effective data updating unit 25a and transfers them to the effective data updating unit 25a when the unit 25a is operated.

The inverse wavelet transform unit 25c generates an inversely transformed signal $VI_0$: $VI_0(n)$ consisting of N data using equations (8) using the extracted smoothed signal $VX_j$, the plurality of extracted details signals $WX_1$ to $WX_j$, and the expansion count J:

$$\left.\begin{array}{l} VI_j = VX_j \\ VI_j(2n) = \sum_{m=1}^{k} \gamma_{2m} VI_{j+1}(n-m) + \sum_{m=1}^{k} \phi_{2m} WX_{j+1}(n-m) \\ VI_j(2n+1) = \sum_{m=1}^{k} \gamma_{2m+1} VI_{j+1}(n-m) + \sum_{m=1}^{k} \phi_{2m+1} WX_{j+1}(n-m) \end{array}\right\} \quad (8)$$

The tolerance determination unit 25d outputs a control signal as an operation start command to operate the output unit 25e using the original signal $V_0$, the tolerance e, and the inversely transformed signal $VI_0$ when all the errors between the original signal and the inversely transformed signals fall within the tolerance range. On the other hand, when all the errors do not fall within the tolerance range, the allowable difference determination unit 25d outputs a control signal so as to operate the effective data updating unit 25a.

When the tolerance determination unit 25d outputs the command to the output unit 25e, the output unit 25e outputs the extracted smoothed signal $VX_j$ and the plurality of extracted details signals $WX_1$ to $WX_j$.

As described above, according to the second embodiment, the details signals (extracted details signals $WX_1$ to $WX_j$) obtained by wavelet transform are also used as compressed data.

That is, in the second embodiment, the tolerance determination unit 25d selects the extracted smoothed signal $VX_j$ and the plurality of extracted details signals $WX_1$ to $WX_j$ so that all the inversely transformed signals $VI_0$ obtained by inverse transform using the extracted smoothed signal $VX_j$ and the plurality of extracted details signals $WX_1$ to $WX_j$ fall within the tolerance range. The selected signals are used as compressed data.

In this way, data compression can be performed to fall within the set tolerance range, and a higher compression ratio can be set.

In the second embodiment, the coefficients are given priorities, which are required to extract necessary coefficients for compression at a higher speed.

Third Embodiment

Figures 3A, 3B:
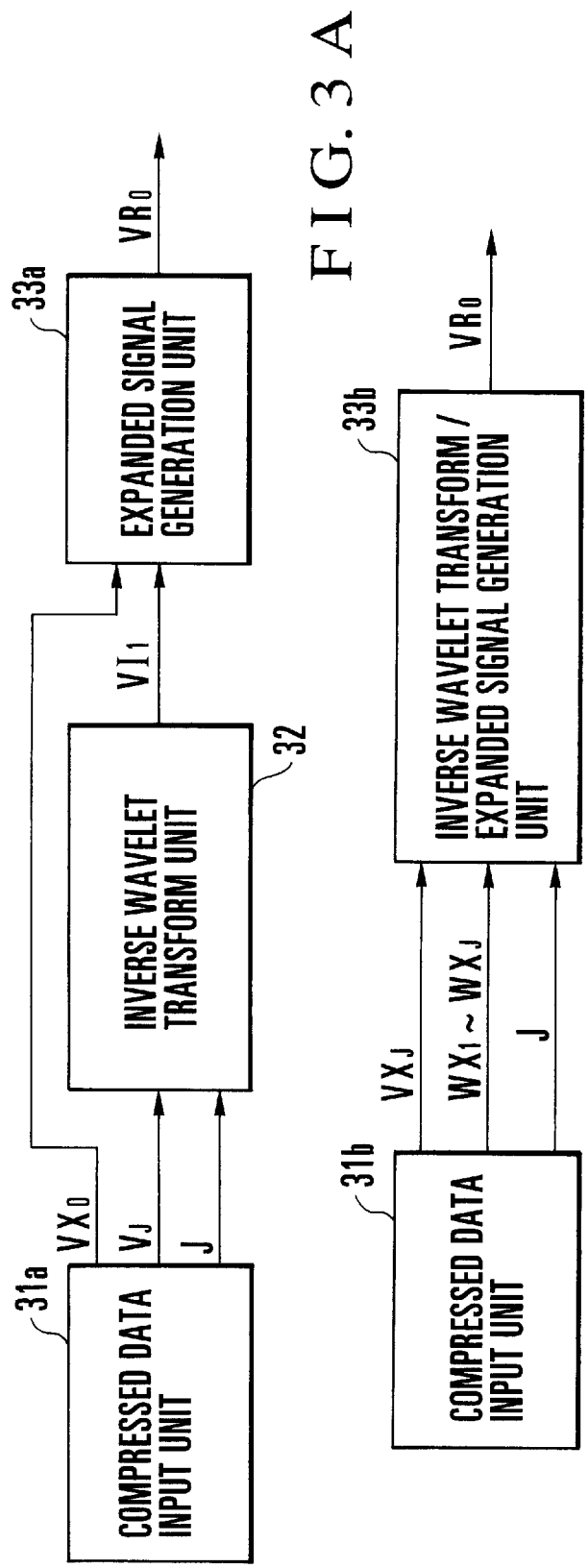
FIGS. 3A and 3B are block diagrams showing the arrangements of data conversion apparatuses according to the third embodiment of the present invention.

FIGS. 3A and 3B show the arrangements of data conversion apparatuses according to the third embodiment of the present invention.

Referring to FIGS. 3A and 3B, reference numerals 31a and 31b denote compressed data input units; 32, an inverse wavelet transform unit; 33a, an expanded signal generation unit; and 33b, an inverse wavelet transform/expanded signal generation unit.

FIG. 3A corresponds to the first embodiment and shows an arrangement in which compressed data obtained in the first embodiment is expanded.

FIG. 3B corresponds to the second embodiment and shows an arrangement in which compressed data obtained in the second embodiment is expanded.

The operation of the data conversion apparatus shown in FIG. 3A will be described first.

The compressed data input unit 31a outputs a corrected signal $VX_0$, a smoothed signal $V_j$, and an expansion count J.

The inverse wavelet transform unit 32 generates an inversely transformed signal $VI_0$: $VI_0(n)$ consisting of N data by equations (8) using the smoothed signal $V_j$ and the expansion count J. Note that the smoothed signal $V_j$ is an extracted smoothed signal $VX_j$ obtained upon extraction of all the elements.

When the nth data of the corrected signal $VX_0$ is 0, the expanded signal generation unit 33a defines the nth data of a target expanded signal $VR_0$ as the nth data of the inversely transformed signal using the corrected signal $VX_0$ and the inversely transformed signal $VI_0$ ($VX_0(n)=0 \rightarrow VR_0(n)=VI_0(n)$).

When the nth data of the corrected signal $VX_0$ is not zero, the expanded signal generation unit 33a defines the nth data of the target expanded signal $VR_0$ as the nth data of the corrected signal $VX_0$ ($VX_0(n) \neq 0 \rightarrow VR_0(n)=VX_0(n)$).

The expanded signal generation unit 33a performs the above operations for n=1 to n=N and generates the expanded signal $VR_0$: $VR_0(n)$ {n=1, 2, ..., N} consisting of N data.

The operation of the data conversion apparatus shown in FIG. 3B will be described below.

The compressed data input unit 31b outputs an extracted smoothed signal $VX_j$ and a plurality of details signals $WX_1$ to $WX_j$, and the expansion count J.

The inverse wavelet transform/expanded signal generation unit 33b inversely wavelet-transforms the input extracted smoothed signal $VX_j$, the plurality of input extracted details signals $WX_1$ to $WX_j$, and the input expansion count J using equations (8) to generate the expanded signal $VR_0(n)$: $VR_0(n)$ {n=1, 2, ..., N} consisting of N data.

As described above, according to the third embodiment, the signals compressed in the first and second embodiments can be expanded.

The numerical values (k=8) of the filters in the above equations are enumerated in Table 1 below.

TABLE 1

| i | $\alpha_i$ | $\beta_i$ | $\gamma_i$ | $\phi_i$ |
|---|---|---|---|---|
| 1 | 0.230378 | −0.010597 | 0.230378 | −0.010597 |
| 2 | 0.714847 | −0.032883 | 0.714847 | −0.032883 |
| 3 | 0.630881 | 0.030841 | 0.630881 | 0.030841 |
| 4 | −0.027984 | 0.187035 | −0.027984 | 0.187035 |
| 5 | −0.187035 | −0.027984 | −0.187035 | −0.027984 |
| 6 | 0.030841 | −0.630881 | 0.030841 | −0.630881 |
| 7 | 0.032883 | 0.714847 | 0.032883 | 0.714847 |
| 8 | −0.010597 | −0.230378 | −0.010597 | −0.230378 |

Fourth Embodiment

Figures 4A, 4B:
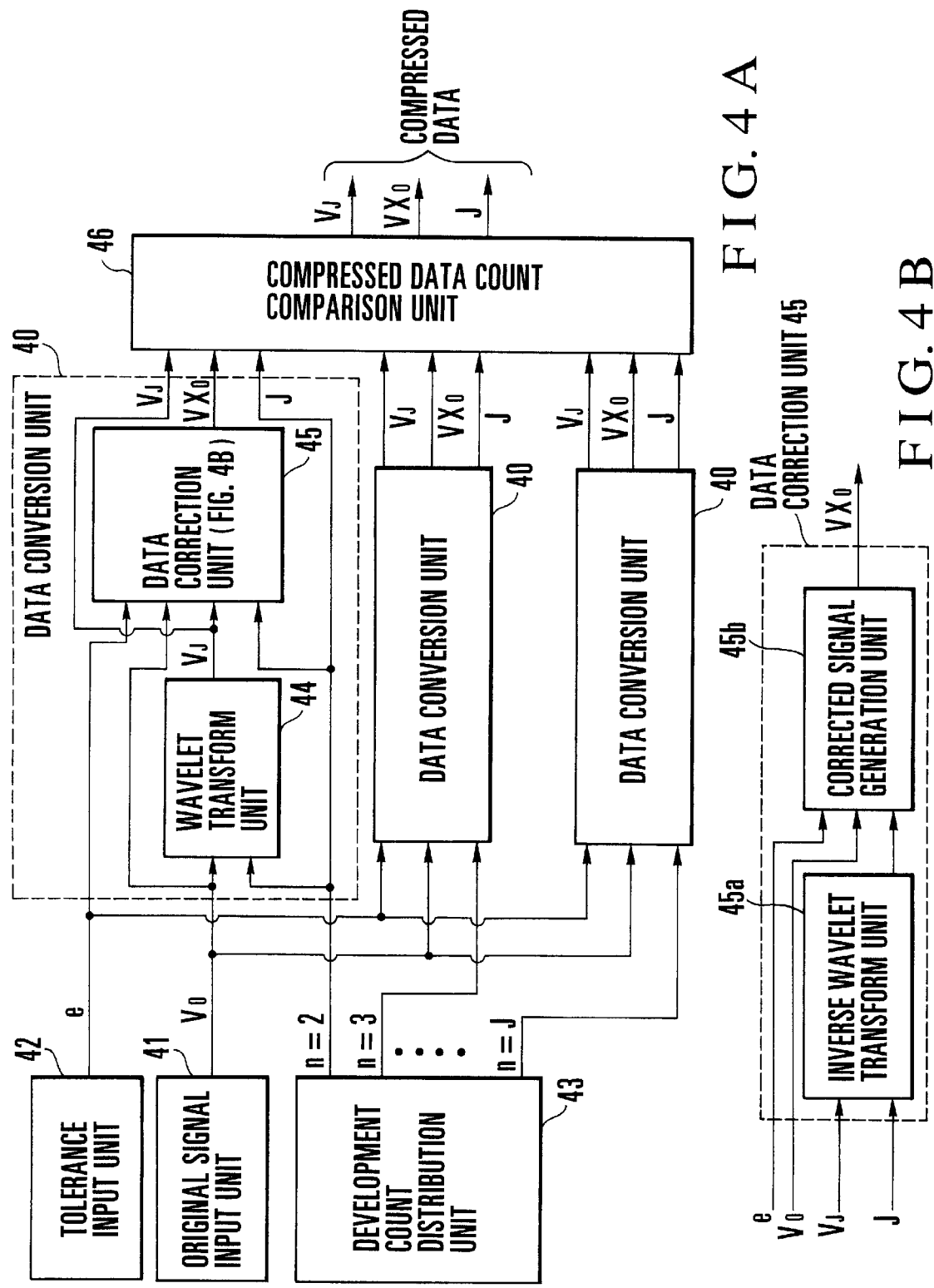
FIGS. 4A and 4B are block diagrams showing the arrangement of a data compression apparatus according to the fourth embodiment of the present invention.

FIGS. 4A and 4B show the arrangement of a data compression apparatus according to the fourth embodiment of the present invention.

Referring to FIG. 4A, reference numeral 41 denotes an original signal input unit for outputting a compressed original signal $V_0$: $V_0(n)$ {n=1, 2, ..., N} consisting of N data. Reference numeral 42 denotes a tolerance input unit for outputting, as a tolerance e, a tolerance range between the original signal $V_0$ and a compressed/expanded signal. Reference numeral 43 denotes an expansion count distribution unit for deciding a combination of wavelet transform expansion counts and outputting the combination.

Reference numeral 44 denotes a wavelet transform unit for generating a smoothed signal $V_j$ by equation (9) using the original signal $V_0$ output from the original signal input unit 41 and an expansion count J determined by the expansion count distribution unit 43:

$$V_{j+1}(n) = \sum_{i=1}^{k} \alpha_i V_j(2n + i) \quad (9)$$

Reference numeral 45 denotes a data correction unit for outputting a corrected signal $VX_0$: $VX_0(n)$ {n=1, 2, ..., N} consisting of N data by using the smoothed signal $V_j$, the original signal $V_0$, the tolerance e, and the expansion count J.

The wavelet transform unit 44 and the data correction unit 45 constitute a data conversion unit 40. A plurality of data conversion units 40 are arranged.

Reference numeral 46 denotes a compressed data count comparison unit. This compressed data count comparison unit 46 calculates and compares the sums of the numbers of data of the smoothed signal $V_j$ and the corrected signal $VX_0$ output from each data conversion unit 40 for each expansion count J. The compressed data count comparison unit 46 outputs the expansion count J corresponding to the minimum number of data, and the corresponding smoothed and corrected signals $V_j$ and $VX_0$.

As shown in FIG. 4B, the data correction unit 45 comprises an inverse wavelet transform unit 45a and a corrected signal generation unit 45b.

The inverse wavelet transform unit 45a outputs an inversely transformed signal $VI_0$: $VI_0(n)$ {n=1, 2, ..., N} consisting of N data by equations (10) using the smoothed signal $V_j$ and the expansion count J:

$$\left. \begin{array}{l} VI_j = VX_j \\[4pt] VI_j(2n) = \sum_{m=1}^{k} \gamma_{2m} VI_{j+1}(n - m) \\[4pt] VI_j(2n + 1) = \sum_{m=1}^{k} \gamma_{2m+1} VI_{j+1}(n - m) \end{array} \right\} \quad (10)$$

On the other hand, the corrected signal generation unit 45b determines whether the absolute value of the error between the nth data of the original signal $V_0$ and the inversely transformed signal $VI_0$ falls within the tolerance e.

If the absolute value of the error is equal to or smaller than the tolerance e, the nth data of the corrected signal $VX_0$ to be output is set to 0 ($|VI_0(n)-V_0(n)| \leq e \rightarrow VX_0(n)=0$).

If the absolute value of the error is larger than the tolerance e, the nth data of the corrected signal $VX_0$ is set as the nth data of the original signal $V_0$ ($|VI_0(n)-V_0(n)| > e \rightarrow VX_0(n)=V_0(n)$).

The above processing is performed from n=1 to n=N, and N corrected signals $VX_0$: $VX_0(n)$ {n=1, 2, ..., N} are output.

As described above, the fourth embodiment comprises the plurality of wavelet transform units 4 (FIG. 1) and the plurality of data correction units 5 (FIG. 1).

A predetermined different expansion count is set in each of the wavelet transform units, and the numbers of resultant compressed data are compared with each other. An expansion count corresponding to the minimum number of compressed data, and the corresponding compressed data are obtained.

In the first and second embodiments, the wavelet expansion count must be appropriately decided. A better compression effect is not necessarily obtained when the expansion count is larger.

An expansion count corresponding the maximum compression ratio is not known in advance. For this reason, when the expansion count is not appropriate, the compression ratio cannot be sufficiently high.

In the fourth embodiment, as an appropriate expansion count range or a combination of expansion counts is decided in advance, an expansion count corresponding to the maximum compression ratio is automatically decided, and thus data is compressed.

An operation for strictly deciding a wavelet expansion count is omitted, and operational efficiency can be improved. In addition, the calculation time can be shortened.

Fifth Embodiment

The fourth embodiment has the plurality of wavelet transform units 4 (FIG. 1) and the plurality of data correction units 5 (FIG. 1). However, a plurality of wavelet transform units 24 (FIG. 2) and a plurality of data correction units 25 (FIG. 2) may be arranged.

With this arrangement, a compression ratio can be set higher than that of the fourth embodiment.

Sixth Embodiment

Figure 5:
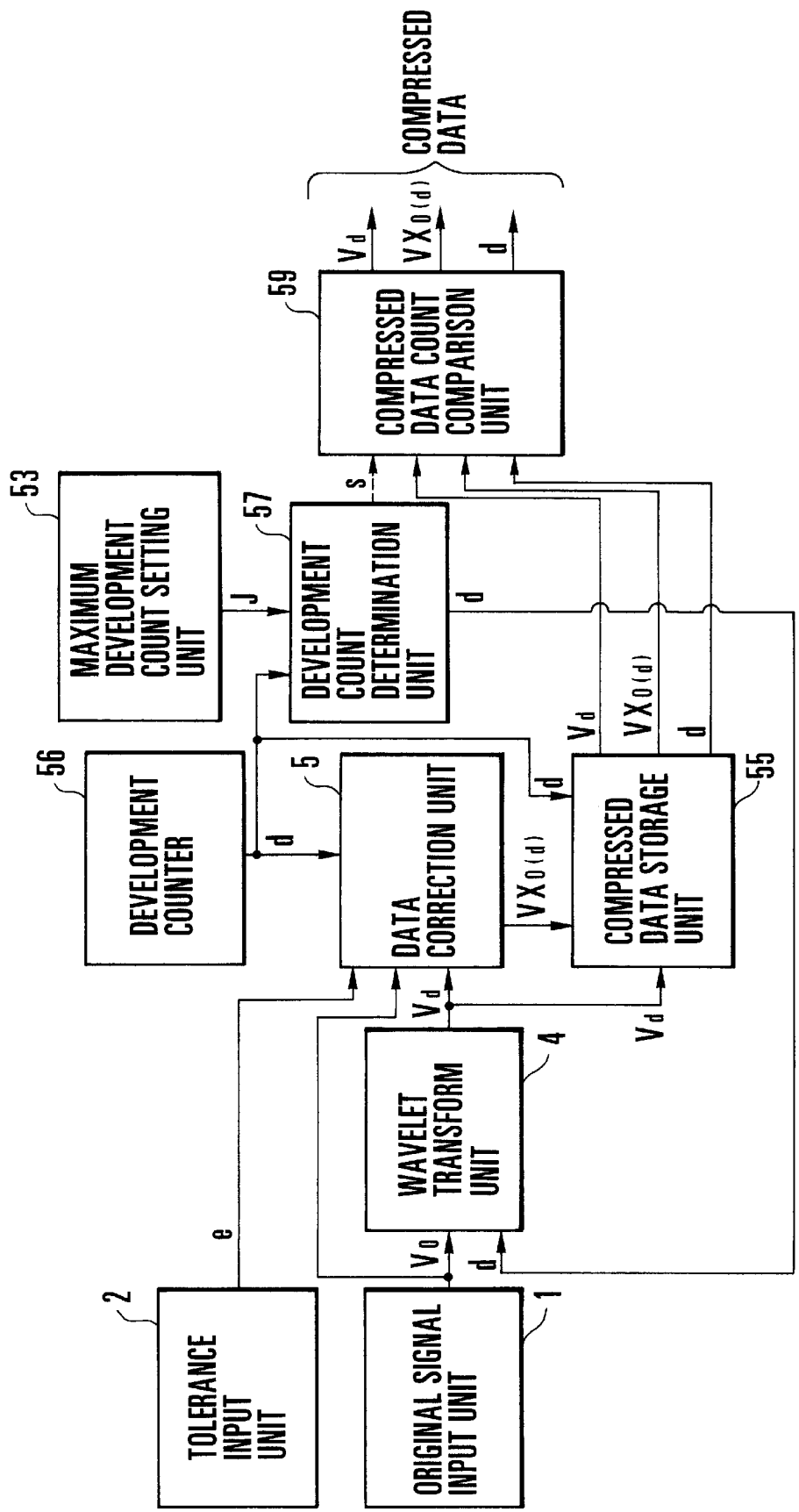
FIG. 5 is a block diagram showing the arrangement of a data compression apparatus according to the sixth embodiment of the present invention.

FIG. 5 shows the arrangement of a data compression apparatus according to the sixth embodiment of the present invention.

Referring to FIG. 5, an original signal input unit 1, a tolerance input unit 2, a wavelet transform unit 4, and a data correction unit 5 are identical to those in FIG. 1, and a detailed description thereof will be omitted.

Referring to FIG. 5, reference numeral 53 denotes a maximum expansion count setting unit for outputting a maximum value J of a desired wavelet transform expansion count in data compression.

Reference numeral 55 denotes a compressed data storage unit for storing expansion counts d, smoothed signals $V_d$, and corrected signals $VX_{0(d)}$ as compressed data in various expansion counts d.

Reference numeral 56 denotes an expansion counter having an initial value of d=1. The count d is incremented by one every time sequential processing is performed, and the incremented count is output.

Reference numeral 57 denotes an expansion count determination unit for sending the expansion count d to the wavelet transform unit 4 when the expansion count from the expansion counter 56 is smaller than the maximum value J from the maximum expansion count setting unit 53. However, when the count d is equal to the value J, the expansion count determination unit 57 sends a control signal s as an operation start command to a compressed data count comparison unit 59.

Upon reception of the operation start command, the compressed data count comparison unit 59 calculates and compares the sums of the numbers of data of $V_d$ and $VX_{0(d)}$ for each d using the smoothed signal $V_d$, the corrected signal $VX_{0(d)}$, and the expansion count d stored in the compressed data storage unit 55.

The compressed data count comparison unit 59 outputs the expansion count d corresponding to the minimum number of data, the corresponding smoothed signal $V_d$, and the corresponding corrected signal $VX_{0(d)}$.

In the sixth embodiment, as in the fourth embodiment, since an appropriate expansion count range or a combination of expansion counts is decided, an expansion count corresponding to the maximum compression ratio is automatically decided, and data is compressed.

An operation for strictly deciding a wavelet expansion count is omitted, and operational efficiency can be improved. In addition, the calculation time can be shortened.

In the sixth embodiment, the apparatus arrangement can be made smaller than those of the fourth and fifth embodiments.

Seventh Embodiment

In obtaining effective data (corrected signal) upon wavelet transform in the sixth embodiment, the arrangement is identical to that of the first embodiment shown in FIG. 1. However, the arrangement may be identical to that of the second embodiment shown in FIG. 2.

With this arrangement, details signals obtained by an optimal expansion order can be considered, so that a compression ratio can be made higher than that of the sixth embodiment.

Eighth Embodiment

To obtain effective data, effective data result are extracted from the entire transform using the entire transform result and the original signal in the second, fifth, and seventh embodiments. However, effective data may be extracted from part of the transform result.

FIGS. 6A and 6B show the arrangement of a data compression apparatus according to the eighth embodiment.

Figure 6:
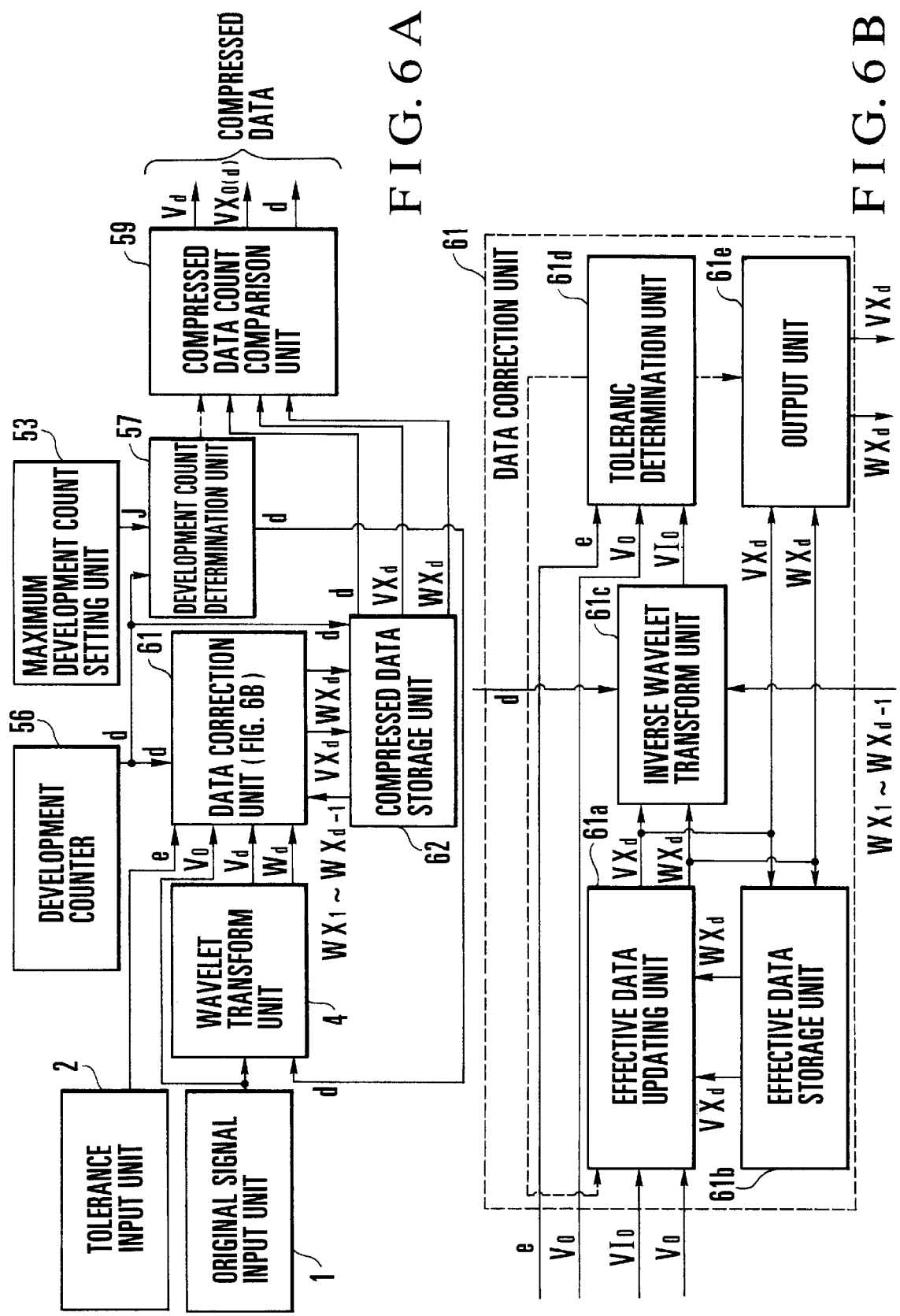
FIGS. 6A and 6B are block diagrams showing the arrangement of a data compression apparatus according to the eighth embodiment of the present invention.

Referring to FIG. 6, a wavelet transform unit 4 is identical to that of FIG. 2, an original signal input unit 1, a tolerance input unit 2, a maximum expansion count setting unit 53, an expansion counter 56, an expansion count determination unit 57, and a compressed data count comparison unit 59 are identical to those of FIG. 5, and a detailed description thereof will be omitted.

Referring to FIG. 6, reference numeral 61 denotes a data correction unit. The data correction unit 61 receives a smoothed signal $V_d$, a details signal $W_d$, an original signal $V_0$, a tolerance e, an expansion count d, and extracted details signals $WX_1$ to $WX_{d-1}$ already stored in a compressed data storage unit 62.

The data correction unit 61 extracts effective data for compression which satisfies the tolerance e from the smoothed signal $V_d$ and the details signal $W_d$. The data correction unit 61 outputs the remaining components as an extracted smoothed signal $VX_d$ and extracted details signal $WX_d$.

The compressed data storage unit 62 stores the remaining extracted smoothed signal $VX_d$, the extracted details signal $WX_d$, and the expansion count d as a set of data.

The data correction unit 61 will be described in detail. As shown in FIG. 6B, the data correction unit 61 comprises an effective data updating unit 61a, an effective data storage unit 61b, an inverse wavelet transform unit 61c, a tolerance determination unit 61d, and an output unit 61e.

The effective data updating unit 61a generates $VX_d$ and $WX_d$ so as to cause all the errors between the original signal $V_0$ and inversely transformed signals $VI_0$ to fall within the allowable range. The inversely transformed signals $VI_0$ are obtained when the extracted smoothed signal $VX_d$ and the plurality of extracted details signals $WX_1$ to $WX_d$ output from the effective data updating unit 61a are input to the inverse wavelet transform unit 61c.

The effective data updating unit 61a sets the initial values as $VX_d \rightarrow V_d$ and $WX_d \rightarrow 0$ and gives priorities to all the data of $W_d$ in an order regarded as important to cause the inversely transformed signals to fall within the tolerance range.

The data of $W_d$ are shifted to $WX_d$ one by one in order every time an operation is performed.

The priorities are given as in the effective data updating unit 25a shown in FIG. 2, as described above.

The effective data storage unit 61b stores an output from the effective data updating unit 61a and supplies the storage data to the effective data updating unit 61a every time this unit 61a is operated.

The inverse wavelet transform unit 61c generates an inversely transformed signal $VI_0$: $VI_0(n)$ {n =1, 2, ..., N} consisting of N data by equations (11) using the smoothed signal $VX_d$, the plurality of details signals $WX_1$ to $WX_d$, and the expansion count:

$$V_j(2n) = \sum_{m=1}^{k} \gamma_{2m} V_{j+1}(n-m) \sum_{m=1}^{k} \phi_{2m} W_{j+1}(n-m)$$

$$V_j(2n+1) = \sum_{m=1}^{k} \gamma_{2m+1} V_{j+1}(n-m) \sum_{m=1}^{k} \phi_{2m+1} W_{j+1}(n-m)$$

$$VI_d = VX_d$$

(11)

The tolerance determination unit 61d determines an error between the original signal $V_0$ and the inversely transformed signal $VI_0$. If the error falls outside the tolerance e, the tolerance determination unit 61d outputs a control signal for operating the effective data updating unit 61a.

As described above, the effective data updating unit 61a shifts the data of $W_d$ to $WX_d$ one by one until all the errors between the original signal $V_0$ and the inversely transformed signals $VI_0$ fall within the tolerance e.

When all the errors between the original signal $V_0$ and the inversely transformed signals $VI_0$ fall within the tolerance e, the tolerance determination unit 61d outputs a control signal for operating the output unit 61e. As a result, the output unit 61e outputs the extracted smoothed signal $VX_d$ and the extracted details signal $WX_d$.

Using these output signals, the compressed data count comparison unit 59 calculates the sums of the numbers of data of $VX_d$ and $WX_1$ to $WX_d$ using the extracted smoothed signal $VX_d$, the extracted details signals $WX_1$ to $WX_d$, and the expansion count d stored in the compressed data storage unit 62 and compares the sums as in the seventh embodiment.

The compressed data count comparison unit 59 outputs an expansion count corresponding to the minimum number of data, and the corresponding smoothed and corrected signals.

That is, according to the eighth embodiment, an extracted smoothed signal and an extracted details signal are obtained from a smoothed signal and a details signal for the expansion count J. The extracted details signals obtained up to the expansion count (J–1) are added to the above extracted smoothed and details signals. The sum is then defined as the compressed data for the expansion count J.

According to the eighth embodiment, since effective data are sequentially selected for the respective expansion counts, the calculation speed can be higher than that of the seventh embodiment.

Ninth Embodiment

Figure 7:
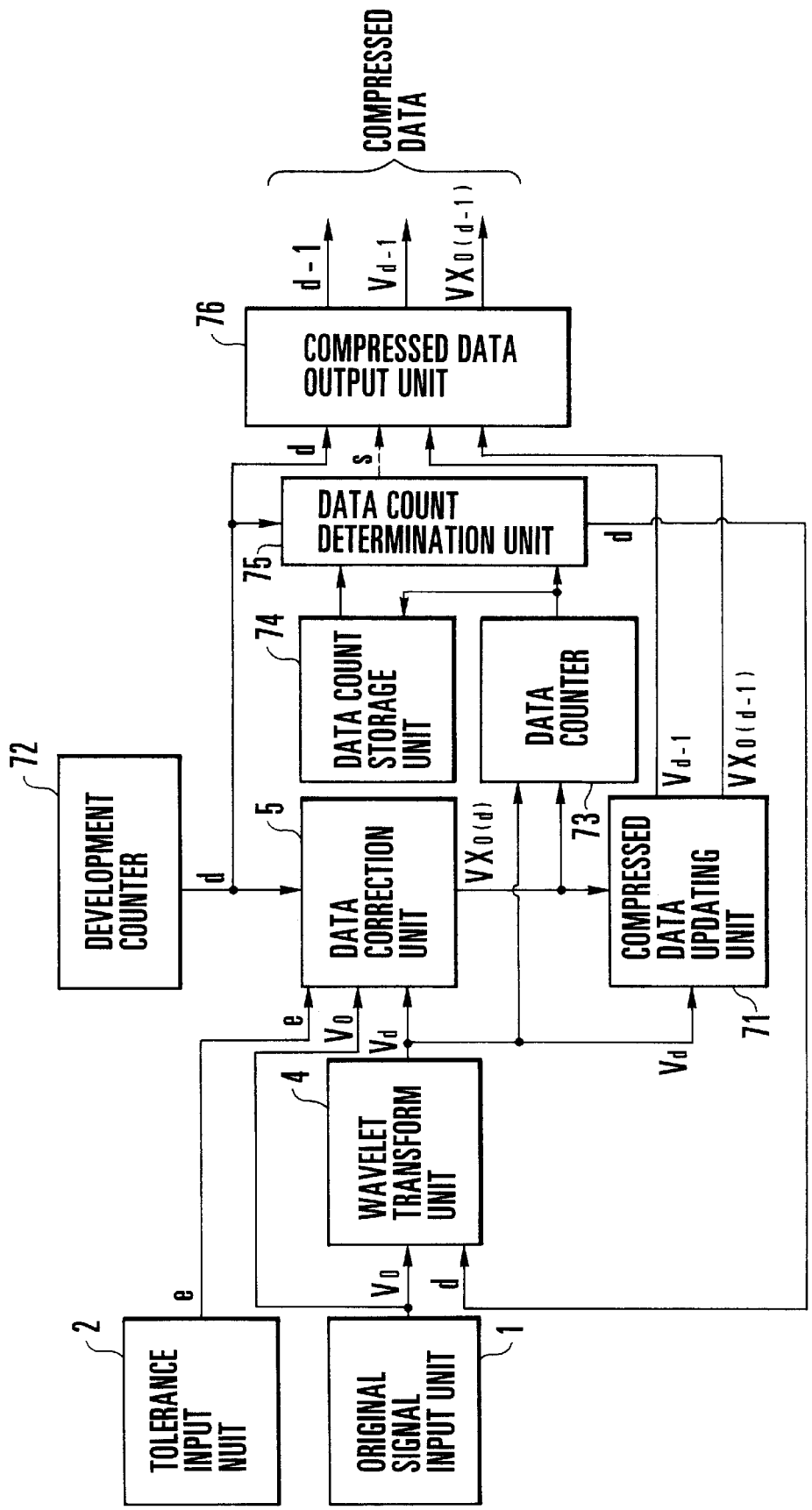
FIG. 7 is a block diagram showing the arrangement of a data compression apparatus according to the ninth embodiment of the present invention.

FIG. 7 shows the arrangement of a data compression apparatus according to the ninth embodiment of the present invention.

Referring to FIG. 7, an original signal input unit 1, a tolerance input unit 2, a wavelet transform unit 4, and a data correction unit 5 are identical to those in FIG. 1, and a detailed description thereof will be omitted.

Referring to FIG. 7, reference numeral 71 denotes a compressed data updating unit for storing, as latest compressed data, a corrected signal $VX_{0(d)}$ output from the data correction unit 5 for an expansion count d and a smoothed signal $V_d$ output from the wavelet transform unit 4 for the expansion count d. The compressed data updating unit 71 outputs $V_{d-1}$ and $VX_{0(d-1)}$ as the previous compressed data.

Reference numeral 72 denotes an expansion counter in which the initial value is set as d=1. Every time a data count determination unit 75 operates, the d value is incremented by one and output.

Reference numeral 73 denotes a data counter for calculating the sums of the numbers of data of the smoothed signal $V_d$ and the corrected signal $VX_{0(d)}$ for the expansion count d and outputting them as a compressed data count $DL_d$.

Reference numeral 74 denotes a data count storage unit for obtaining and storing a current compressed data count $DL_d$ from the data counter 74 for the expansion count d and outputting the previous compressed data count $DL_{d-1}$ instead of the current compressed data count $DL_d$.

The data count determination unit 75 compares the current compressed data count $DL_d$ for the expansion count d with the previous compressed data count $DL_{d-1}$. If $DL_d$ is larger than $DL_{d-1}$, the data count determination unit 75 sends an updated expansion count (d+1) to the wavelet transform unit 4; otherwise, the data count determination unit 75 outputs control signals to a compressed data output unit 76 to operate it.

Upon reception of an operation command from the data count determination unit 75, the compressed data output unit 76 outputs the previous compressed data output from the compressed data updating unit 71 and the previous expansion count output from the expansion counter 72.

In the ninth embodiment, an expansion count for obtaining a maximum compression ratio is automatically decided without determining an expansion count in advance, and the data is compressed at the decided compression ratio.

That is, as described above, the expansion count is increased and compression continues until the compression ratio becomes lowered. Only the original signal and the tolerance are input without setting a maximum expansion count, and compressed data with an optimal expansion order can be obtained.

An operation for strictly deciding a wavelet expansion count is omitted, and operational efficiency can be improved.

10th Embodiment

In the ninth embodiment, the arrangement of the wavelet transform unit and the data correction unit may be identical to that of the second embodiment shown in FIG. 2 or to that of the eighth embodiment shown in FIG. 6.

With the above arrangement, finally obtained compressed data are determined in consideration of details signals corresponding to the optimal expansion count (order). A compression ratio can be set higher than that of the ninth embodiment described above.

The present invention will be described in detail by way of its examples below.

Compressed/expanded data can be used in a variety of applications such as data analysis, control, abnormality diagnosis, and detection. Abnormality detection will be exemplified as follows.

The abnormality detection of a manufacturing process using a blast furnace will be described below. In the manufacturing process, when a phenomenon in which the temperature in the blast furnace abruptly changes appears, defective products are undesirably caused. To reduce a ratio of the number of defective products to the total number of products, an abnormal change in temperature in the blast furnace must be quickly detected.

Figure 8:
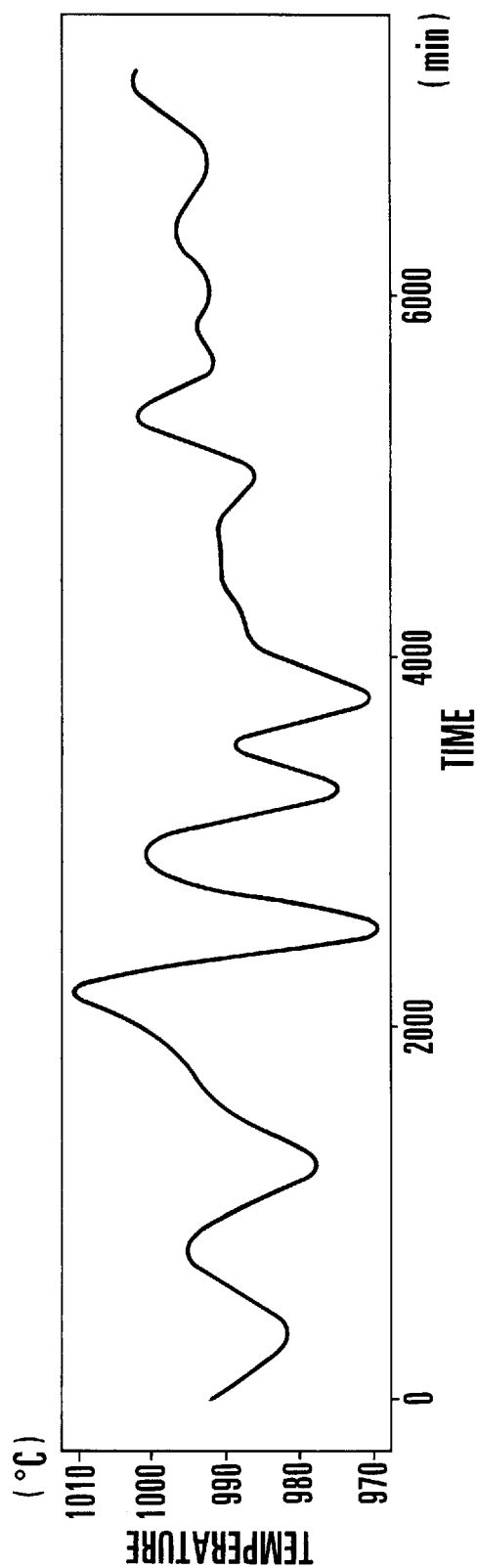
FIG. 8 is a graph showing data obtained when the temperature in a blast furnace is measured every minute.

FIG. 8 is a graph showing 7,200 temperature data of the blast furnace which were measured every minute from 0:00, the first day of a certain month, 1995 to 23:59, the fifth day of this month.

To quickly detect an abnormal change in temperature in the blast furnace, the feature is analyzed from the actual past history data. The past history data include temperatures in the blast furnace and process states (abnormal or normal state) at the time of measurement.

A large amount of data shown in FIG. 8 is held, and the above feature is analyzed as follows.

When a "change in temperature per minute" is defined as a temperature change rate, the difference between the average of temperature change rates for a time interval from given time t to 10 minutes before the given time t and the average of temperature change rates for a time interval from the given time t to 10 minutes after the given time t is equal to or larger than 0.1 (°C./min), the process is regarded to be set in an abnormal state.

Figure 9A:
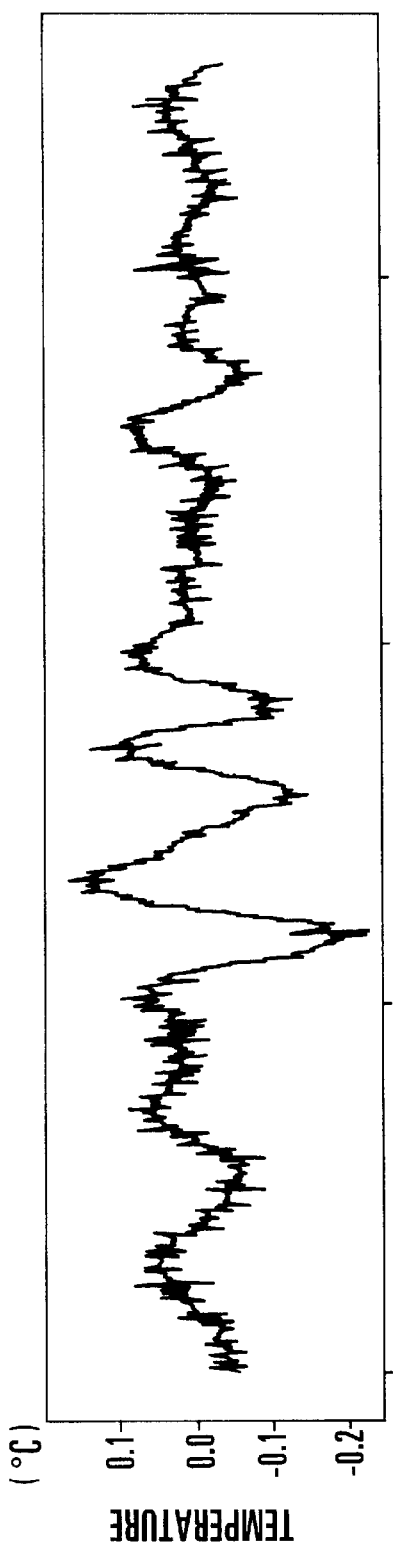
FIGS. 9A and 9B are graphs showing data obtained by the first-order differential.

The data in FIG. 8 are obtained by measuring the blast furnace temperature every minute. When the measurement data are subjected to first-order differential to obtain data representing the temperature change rates, as shown in FIG. 9A. Note that no abnormality appeared in the process during the measurement interval.

Figure 9B:
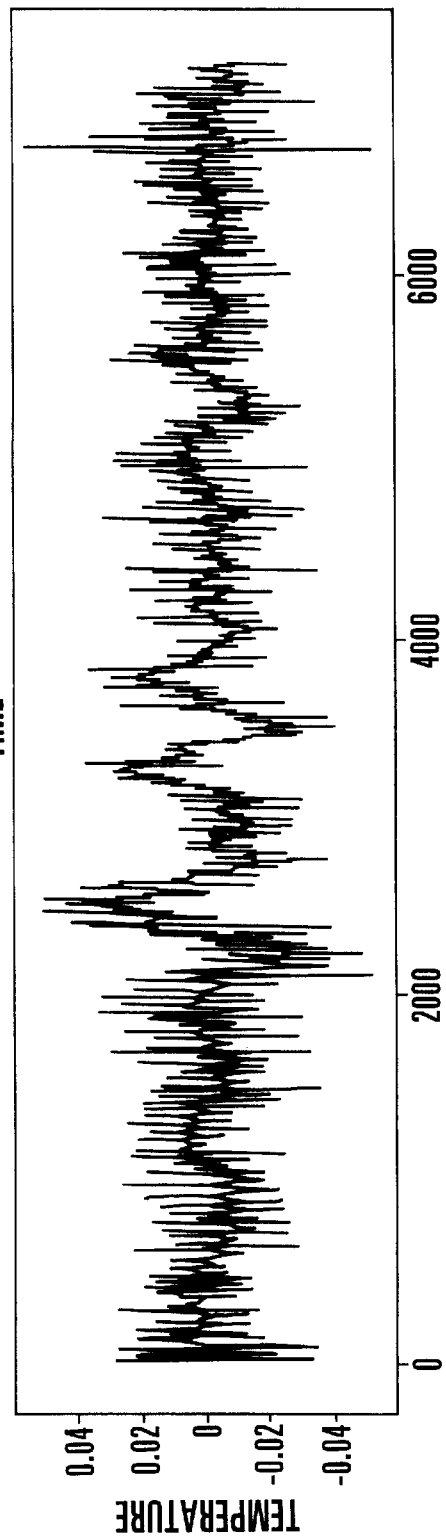

The difference between the average of 10 first-order differential data preceding from given first-order differential data and the average of 10 first-order differential data succeeding from the given fist-order differential data is calculated to obtain data shown in FIG. 9B. These data represent the difference between the average of the temperature change rates from the given time to 10 minutes before the given time and the average of the temperature change rates from the given time to 10 minutes after the given time.

As can be apparent from FIG. 9B, it is found that the above analysis result is not contradictory to the data in FIG. 9B.

In arranging an apparatus, it is generally undesirable that a large amount of data shown in FIG. 8 be stored. To hold a large amount of data, a memory unit must have a larger capacity to result in a high apparatus cost and pose many other problems.

Under the above circumstances, the data shown in FIG. 8 are generally held compressed and then expanded in analysis.

Figures 10A, 10B:
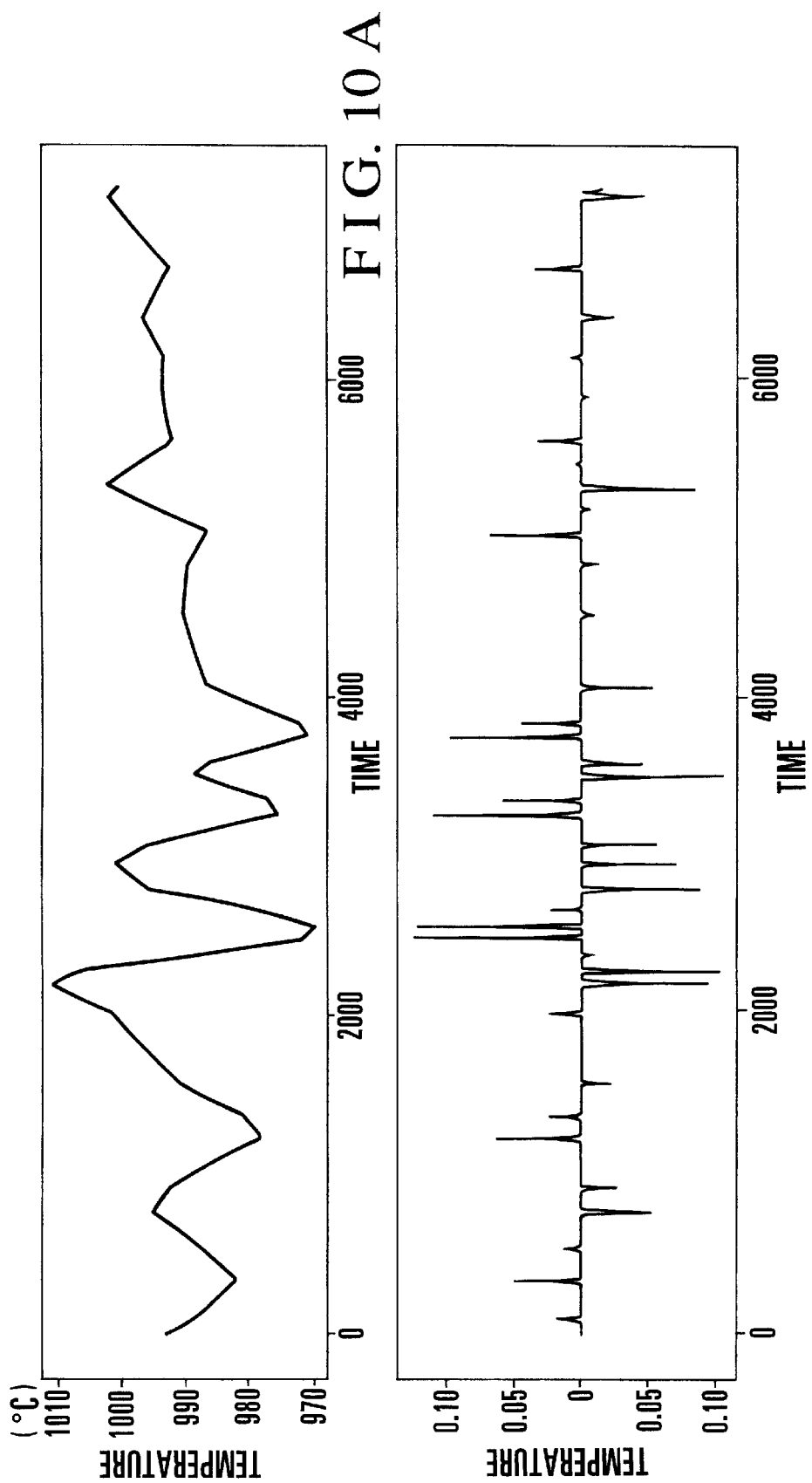
FIGS. 10A and 10B are graphs showing results obtained by compressing data shown in FIG. 8 by a conventional technique and expanding the compressed data.

The data in FIG. 8 are compressed and expanded with a tolerance of 3% by a conventional technique, as shown in FIG. 10A.

When the data corresponding to the difference between the average of the preceding 10-minute temperature change rate data and the average of the succeeding 10-minute temperature change rate data is obtained, as shown in FIG. 10B.

The data shown in FIG. 10B are contradictory to the analysis result derived from the data in FIG. 8. In the conventional compression/expansion, components not included in the original signal appear to cause an abrupt change not found in the original signal.

To the contrary, in the data compressed/expanded with the tolerance of 3% by the data compression apparatus of the present invention, the data can be expanded to be almost identical to the original data shown in FIG. 8. In this case, the average error was 1.62%, and a compression ratio was 154.

Figures 11A, 11B:
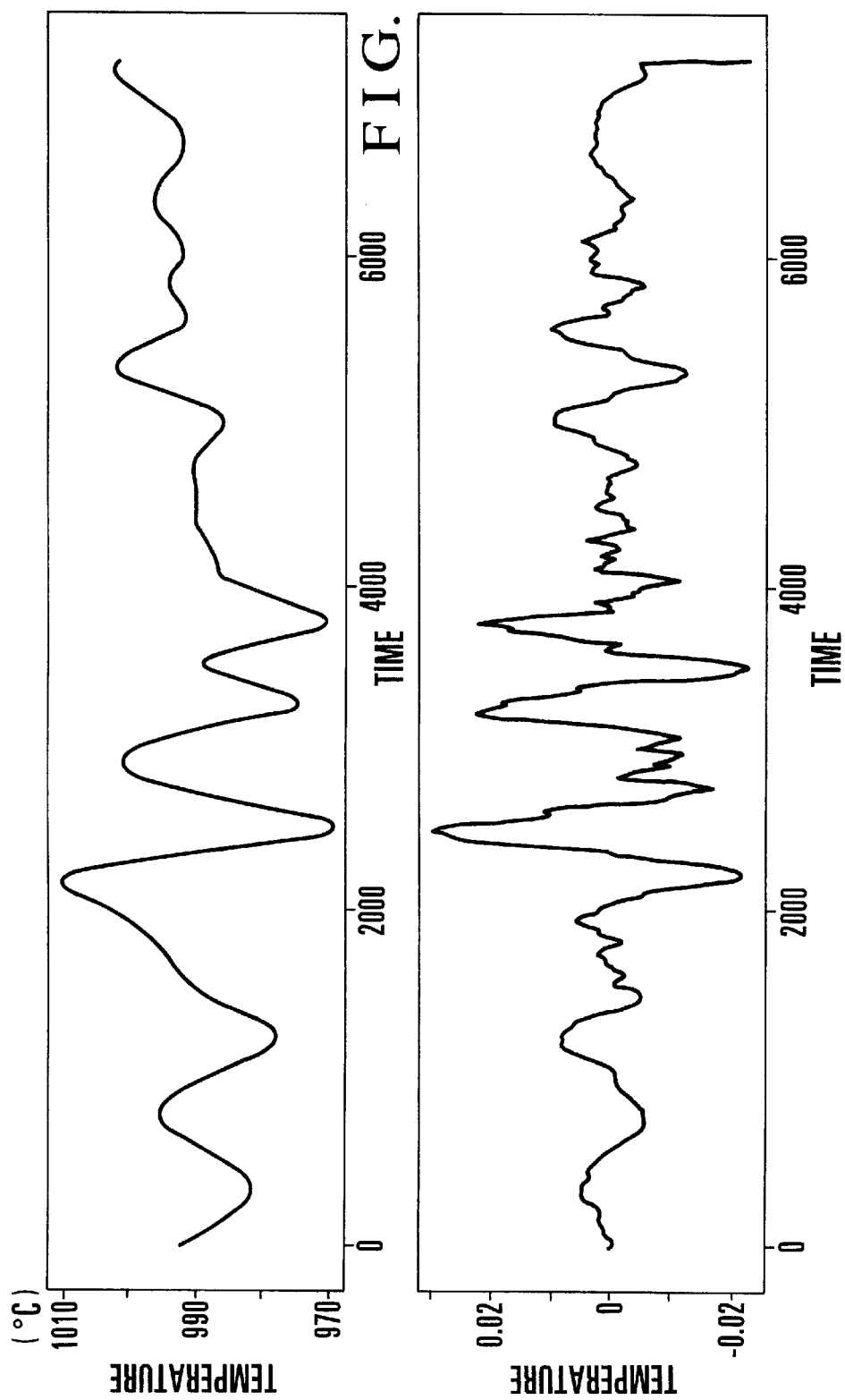
FIGS. 11A and 11B are graphs showing data compressed and expanded by the present invention.

The difference between the average of 10 first-order differential data preceding from given first-order differential data and the average of 10 first-order differential data succeeding from the given fist-order differential data shown in FIG. 11A is calculated as shown in FIG. 11B. The compressed data of the original data in FIG. 8 are almost faithfully expanded. The data in FIG. 11B are not contradictory to the conclusion derived from the data in FIG. 8.

The present invention is effective for compression and expansion of the original data in abnormality diagnosis for checking signal discontinuities.

Figures 12A, 12B:
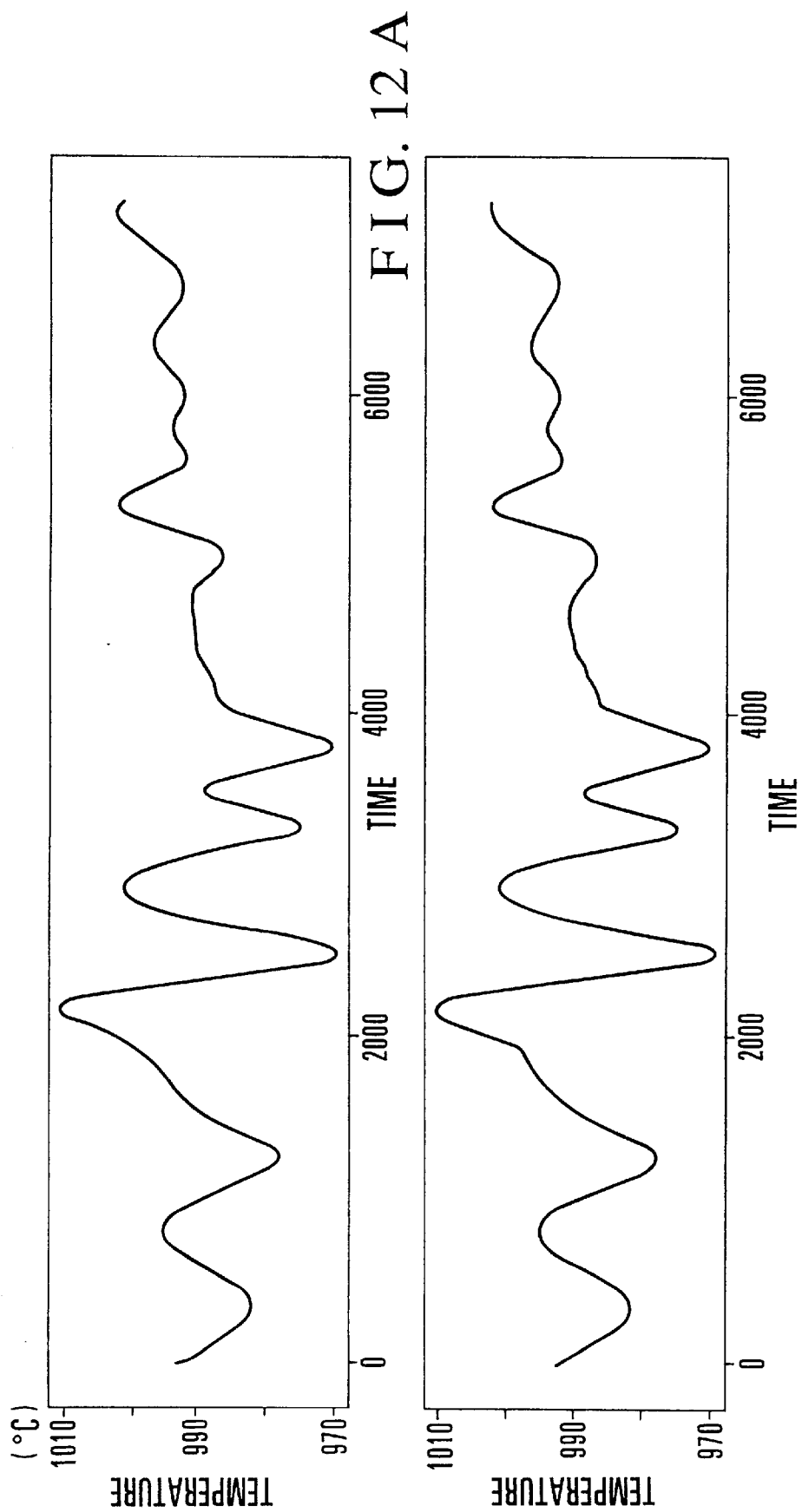
FIGS. 12A and 12B are graphs showing data compressed and expanded by the present invention.

FIGS. 12A and 12B show data representing the results obtained by compressing and expanding data with the tolerance of 3% by the data compression apparatus of the present invention. FIG. 12A shows a case in which the expansion count was 2, the average error was 0.003%, and the compression ratio was 1.99.

FIG. 12B shows a case in which the expansion count was 9, the average error was 0.343%, and the compression ratio was 147.

As has been described above, according to the present invention, wavelet-transformed data is inversely wavelet-transformed, and it is determined that the inversely wavelet-transformed data falls within the tolerance with respect to the original data.

A tolerance can be set in data conversion. For example, the compressed/expanded data is guaranteed to fall within the tolerance range with respect to the original data, and a higher reliability can be obtained.

What is claimed is:

1. A data conversion method comprising the steps of:

wavelet-transforming an original signal with a predetermined expansion count to transform said original signal to a transformed data including a smoothed signal and at least one details signal;

generating a corrected signal formed from said original signal for a portion where the difference between an inverse wavelet-transformed value from said transformed data and said original signal exceeds a predetermined tolerance; and generating a compressed data of said original signal from components including said expansion count, said smoothed signal, and said corrected signal.

2. The method according to claim 1, further comprising the steps of:

generating a plurality of compressed data with a plurality of expansion counts; and selecting from the plurality of resultant compressed data, a compressed data for an expansion count corresponding to a least number of components within the compressed data.

3. The method according to claim 2, wherein the step of generating a plurality of compressed data, further comprises the step of:

simultaneously generating the plurality of compressed data with the plurality of expansion counts.

4. A method according to claim 1, further comprising the steps of:

performing inverse wavelet transform using the smoothed signal and the expansion count to generate an inversely transformed signal; and generating an expanded signal using the inversely transformed signal and the corrected signal.

5. The method according to claim 1, further comprising the step of:

generating said corrected signal which is the original signal.

6. The method according to claim 1, further comprising the steps of:

generating a plurality of details signals;

giving priority to the details signals in an order considered important for inversely transformed signals to fall within said tolerance range; and generating compressed data according to said priority.

7. The method according to claim 1, further comprising the steps of:

generating a plurality of compressed data by increasing the expansion count by a predetermined number; and selecting the compressed data for a previously set expansion count when a number of components in the compressed data obtained by a currently set expansion count is greater than a number of components in the compressed data obtained by the previously set expansion count.

8. A data conversion method comprising the steps of:

wavelet transforming an original signal by a predetermined expansion count to obtain a transformed data including a smoothed signal and at least one details signal;

generating an extracted smoothed signal and an extracted details signal obtained by extracting data respectively from said smoothed signal and details signal within a range in which a difference between the original signal and a value obtained by inverse transform using the smoothed signal and the details signal does not exceed a predetermined tolerance is the difference between the inverse wavelet transformed value and said original signal exceeds the predetermined tolerance regarding the smoothed signal in said transformed data; and generating a compressed data by compressing said original signal from components including of said expansion count and said extracted smoothed signal and said extracted details signal.

9. The method according to claim 8, further comprising the steps of:

generating a plurality of compressed data with a plurality of expansion counts; and selecting from the plurality of resultant compressed data, a compressed data for an expansion count corresponding to a least number of components within the compressed data.

10. The method according to claim 9, wherein the step of generating a plurality of compressed data, further comprises the step of:

simultaneously generating the plurality of compressed data with the plurality of expansion counts.

11. The method according to claim 8, further comprising the steps of:

generating a plurality of compressed data by increasing the expansion count by a predetermined number; and selecting the compressed data for a previously set expansion count when a number of components in the compressed data obtained by a currently set expansion count is greater than a number of components in the compressed data obtained by the previously set expansion count.

12. A method according to claim 8, further comprising the step of performing inverse wavelet transform using the extracted smoothed signal and the extracted details signal to generate an expanded signal.

13. A data conversion apparatus comprising:

a data conversion unit to wavelet-transform an original signal by a predetermined expansion count to obtain a transformed data including a smoothed signal and at least one details signal;

a data correction unit to generate a corrected signal formed from the original signal for a portion where the difference between an inverse wavelet-transformed value from said transformed data and said original signal exceeds a predetermined tolerance; and a compressed data generating unit to generate a compressed data of said original signal from components including said expansion count, said smoothed signal, and said corrected signal.

14. The apparatus according to claim 13, wherein said corrected signal is the original signal.

15. The apparatus according to claim 14, further comprising:

an expansion count counter to set to said data conversion unit a plurality of expansion counts to be increased by a predetermined number; and a determination unit to select and output the compressed data for a previously set expansion count if a number of components obtained by a currently set expansion count is greater than a number of components obtained by the previously set expansion count.

16. The apparatus according to claim 14, further comprising:

an inverse wavelet transform unit to generate an inverse transform signal by performing inverse wavelet transform using said smoothed signal and said expansion count; and an expansion signal generation unit to output by generating an expanded signal using said inversely transformed signal and said corrected signal.

17. The apparatus according to claim 13, having a plurality of details signals further comprising:

a data updating unit to give priority ratings to the plurality of details signals in an order of considered importance for inversely transformed signals to fall within a tolerance range, and said compressed data generating unit generating compressed data according to said priority rating.

18. The apparatus according to claim 13, having a plurality of data conversion units and a plurality of data correction units further comprising:

an expansion count distribution unit to determine a combination of wavelet-transform expansion counts to use in the respective data conversion units; and a data count comparison unit to select the compressed data having a least number of components from among a plurality of the compressed data obtained respectively from said data correction units.

19. The apparatus according to claim 13, further comprising:

a maximum expansion count setting unit to set a plurality of expansion counts to said data conversion unit within a predetermined maximum expansion count range; and a determination unit to select and output the compressed data having a least number of components from among the plurality of compressed data obtained respectively in said plurality of expansion counts.

20. A data conversion apparatus comprising:

a data transforming unit to wavelet-transform an original signal by a predetermined expansion count to obtain a transformed data including a smoothed signal and at least one details signal;

a data correction unit, in a portions where a difference between an inverse wavelet transformed value and said original signal exceeds a predetermined tolerance regarding the smoothed signal in said transformed data, to generate an extracted smoothed signal and an extracted details signal obtained by extracting data respectively from said smoothed signal and details signal within a range in which a difference between the original signal and a value obtained by inverse transform using the smoothed signal and the details signal does not exceed said predetermined tolerance, and in portions where the difference between the value obtained by the inverse wavelet transform and said original signal is within said tolerance range, said smoothed signal is used as it is; and a compressed data generation unit to generate a compressed data of said original signal from components including said extracted smoothed signal and said extracted details signal and said expansion count.

21. The apparatus according to claim 20, having a plurality of data conversion units and a plurality of data correction units further comprising:

an expansion count distribution unit to determine a combination of wavelet-transform expansion counts to use in the respective data conversion units; and a data count comparison unit to select the compressed data having a least number of components from among a plurality of the compressed data obtained respectively from said data correction units.

22. The apparatus according to claim 20, further comprising:

a maximum expansion count setting unit to set a plurality of expansion counts to said data conversion unit within a predetermined maximum expansion count range; and a determination unit to select and output the compressed data having a least number of components from among the plurality of compressed data obtained respectively in said plurality of expansion counts.

23. The apparatus according to claim 20, further comprising:

an expansion count counter to set to said data conversion unit a plurality of expansion counts to be increased by a predetermined number; and a determination unit to select and output the compressed data for a previously set expansion count if a number of components obtained by a currently set expansion count is greater than a number of components obtained by the previously set expansion count.

24. The apparatus according to claim 20, further comprising:

an expanded signal generation unit, by performing inverse wavelet transform using said extracted smoothed signal and said extracted details signal, to generate and output an expanded signal.

* * * * *